US011183480B2

(12) United States Patent
Mawatari

(10) Patent No.: US 11,183,480 B2
(45) Date of Patent: Nov. 23, 2021

(54) SEMICONDUCTOR DEVICE

(71) Applicant: DENSO CORPORATION, Kariya (JP)

(72) Inventor: Kazuaki Mawatari, Kariya (JP)

(73) Assignee: DENSO CORPORATION, Kariya (JP)

( * ) Notice: Subject to any disclaimer, the term of this patent is extended or adjusted under 35 U.S.C. 154(b) by 62 days.

(21) Appl. No.: 16/545,141

(22) Filed: Aug. 20, 2019

(65) Prior Publication Data

US 2019/0371762 A1 Dec. 5, 2019

Related U.S. Application Data

(63) Continuation of application No. PCT/JP2018/005301, filed on Feb. 15, 2018.

(30) Foreign Application Priority Data

Mar. 3, 2017 (JP) .............................. JP2017-040670

(51) Int. Cl.
H01L 23/495 (2006.01)
H01L 23/00 (2006.01)
H01L 25/065 (2006.01)

(52) U.S. Cl.
CPC ........ H01L 24/83 (2013.01); H01L 23/49513 (2013.01); H01L 24/26 (2013.01); H01L 24/85 (2013.01); H01L 25/0657 (2013.01)

(58) Field of Classification Search
None
See application file for complete search history.

(56) References Cited

U.S. PATENT DOCUMENTS

| 6,593,662 | B1 * | 7/2003 | Pu | H01L 23/4334 257/777 |
| 2003/0038355 | A1 * | 2/2003 | Derderian | H01L 23/49575 257/686 |
| 2003/0057538 | A1 | 3/2003 | Watson | |
| 2003/0170444 | A1 * | 9/2003 | Stewart | H01L 23/293 428/317.7 |
| 2005/0224959 | A1 * | 10/2005 | Kwon | H01L 24/32 257/723 |
| 2007/0210447 | A1 * | 9/2007 | Kinsley | H05K 3/325 257/723 |
| 2008/0054433 | A1 * | 3/2008 | Yoo | H01L 25/18 257/686 |

(Continued)

FOREIGN PATENT DOCUMENTS

| JP | H04-038859 A | 2/1992 |
| JP | H10-303345 A | 11/1998 |
| JP | 2005-216972 A | 8/2005 |

(Continued)

*Primary Examiner* — Xiaoming Liu
(74) *Attorney, Agent, or Firm* — Posz Law Group, PLC

(57) ABSTRACT

A semiconductor device includes: a substrate; a semiconductor chip disposed adjacent to a front surface of the semiconductor substrate; an adhesive fixing a back surface of the semiconductor chip to the front surface of the substrate; and a plurality of spacers disposed to regulate a distance between the substrate and the semiconductor chip. The spacers are bonded to the front surface of the substrate or the back surface of the semiconductor chip, and are located on respective vertexes of a polygon surrounding a center of gravity of the semiconductor chip.

10 Claims, 4 Drawing Sheets

(56) References Cited

U.S. PATENT DOCUMENTS

2009/0278244 A1    11/2009  Dunne et al.
2015/0364455 A1*  12/2015  Crobu .................... H01L 24/49
                                                                                           257/417

FOREIGN PATENT DOCUMENTS

| JP | 2006-228809 A | 8/2006 |
| JP | 4299685 B2 | 7/2009 |
| JP | 2012-074636 A | 4/2012 |
| JP | 2012-243906 A | 12/2012 |
| JP | 2014-099584 A | 5/2014 |
| WO | 2018/116785 A1 | 6/2018 |

* cited by examiner

US 11,183,480 B2

SEMICONDUCTOR DEVICE

CROSS REFERENCE TO RELATED APPLICATIONS

The present application is a continuation application of International Patent Application No. PCT/JP/2018/005301 filed on Feb. 15, 2018, which designated the U.S. and claims the benefit of priority from Japanese Patent Application No. 2017-40670 filed on Mar. 3, 2017. The entire disclosures of all of the above applications are incorporated herein by reference.

TECHNICAL FIELD

The present disclosure relates to a semiconductor device.

BACKGROUND

In regard to a semiconductor device in which a semiconductor chip is fixed to a substrate with an adhesive, it has been proposed a method for fixing a semiconductor chip to a substrate using an adhesive containing spherical particles so as to restrict inclination of the semiconductor chip relative to the substrate.

SUMMARY

The present disclosure describes a semiconductor device including a substrate, a semiconductor chip disposed adjacent to a front surface of the substrate, an adhesive fixing a rear surface of the semiconductor chip to the front surface of the substrate, and a plurality of spacers regulating a distance between the substrate and the semiconductor chip.

DETAILED DESCRIPTION

Figure 1:
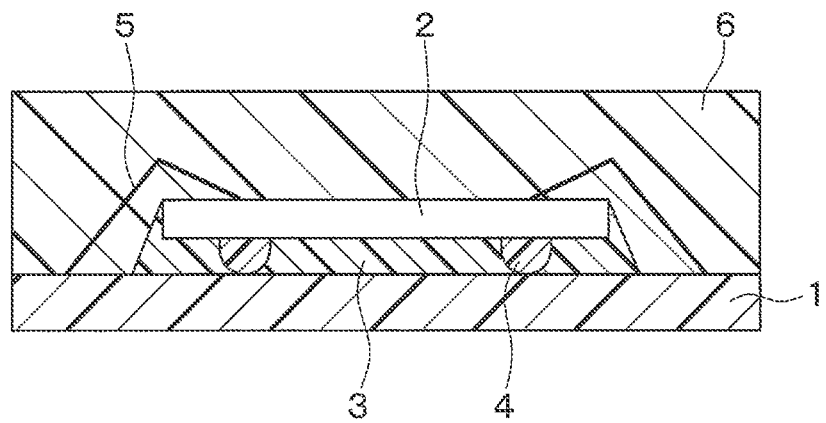
FIG. 1 is a diagram illustrating a cross-sectional view of a semiconductor device according to a first embodiment.

In a case where spherical particles are used in an adhesive having a high viscosity, it is difficult to mix the adhesive and the spherical particles, resulting in unevenness in distribution of the spherical particles in the adhesive. In such a case, the semiconductor chip will not be adequately supported by the spherical particles, and be inclined relative to the substrate.

The present disclosure provides a semiconductor device and a method for manufacturing the semiconductor device, which are capable of suppressing the inclination of the semiconductor chip with respect to the substrate.

According to an aspect of the present disclosure, a semiconductor device includes: a substrate; a semiconductor chip disposed adjacent to a front surface of the substrate; an adhesive fixing a back surface of the semiconductor chip to the front surface of the substrate; and a plurality of spacers regulating a distance between the substrate and the semiconductor chip. The spacers are bonded to the front surface of the substrate or the back surface of the semiconductor chip, and are located at vertexes of a polygon that are defined to surround the center of gravity of the semiconductor chip in an in-plane direction of the back surface of the semiconductor chip.

Since the spacers are arranged to as to surround the center of gravity of the semiconductor chip, the semiconductor chip is supported at both sides with respect to the center of gravity. Thus, it is less likely that the semiconductor chip will be inclined with respect to the substrate due to the weight of the semiconductor chip.

According to another aspect of the present disclosure, a method for manufacturing a semiconductor device, which includes a substrate, a semiconductor chip disposed adjacent to a front surface of the substrate; an adhesive for fixing a back surface of the semiconductor chip to the front surface of the substrate. The method includes forming spacers to be bonded on the front surface of the substrate or the back surface of the semiconductor chip at positions corresponding to vertexes of a polygon surrounding the center of gravity of the semiconductor chip; applying the adhesive on the back surface of the semiconductor chip; and fixing the back surface of the semiconductor chip to the front surface of the substrate with the adhesive so that a distance between the back surface of the semiconductor chip and the front surface of the substrate is regulated by the spacers.

Since the spacers are arranged so as to surround the center of gravity of the semiconductor chip, the semiconductor chip is supported at both sides with respect to the center of gravity. Thus, it is less likely that the semiconductor chip will be inclined with respect to the substrate due to the weight of the semiconductor chip.

Hereinafter, embodiments of the present disclosure will be described with reference to the drawings. In the following descriptions of the embodiments, the same or equivalent parts will be designated with the same reference numbers.

First Embodiment

A first embodiment will be described. As shown in FIG. 1, a semiconductor device of the present embodiment includes a substrate 1, a semiconductor chip 2, an adhesive 3, a plurality of spacers 4, bonding wires 5 and a sealing resin 6.

The substrate 1 is provided by a printed board made of a resin, such as an epoxy resin or a glass epoxy resin, as a base material. The semiconductor chip 2 is provided by a board made of Si or the like and in which a semiconductor element is formed. The semiconductor chip 2 is disposed adjacent to a front surface of the substrate 1. The semiconductor chip 2 has a rectangular plate shape, and a back surface of the semiconductor chip 2 is fixed to the front surface of the substrate 1 with the adhesive 3. The adhesive 3 is, for example, made of a silicone resin or an epoxy resin. The adhesive 3 and the spacers 4 are disposed between the substrate 1 and the semiconductor chip 2.

The spaces 4 regulate a distance between the substrate 1 and the semiconductor chip 2. In the present embodiment, the spacers 4 are bonded to the back surface of the semiconductor chip 2. The spacers 4 are located on vertexes of a polygon surrounding the center of gravity of the semiconductor chip 2 in an in-plane direction of the back surface of the semiconductor chip 2. With such a configuration, it is less likely that the semiconductor chip 2 will be inclined due to its weight and thus the distance between the substrate 1 and the semiconductor chip 2 is kept constant.

At least three spacers 4 are used. In the case where the semiconductor device has three spacers 4, the spacers 4 can be arranged on vertexes of a triangle surrounding the center of gravity of the semiconductor chip 2. The spacers 4 may be arranged such that a part of the plurality of spacers 4 surround the center of gravity.

The plurality of spacers 4 are arranged symmetrically respect to the center of the semiconductor chip 2 in the in-plane direction of the back surface of the semiconductor chip 2. In the case where the spacers 4 are arranged in such a manner, the deformation of the semiconductor chip 2 due to the difference of coefficient of linear expansion between the substrate 1 and the semiconductor chip 2 can be alleviated.

Figure 2:
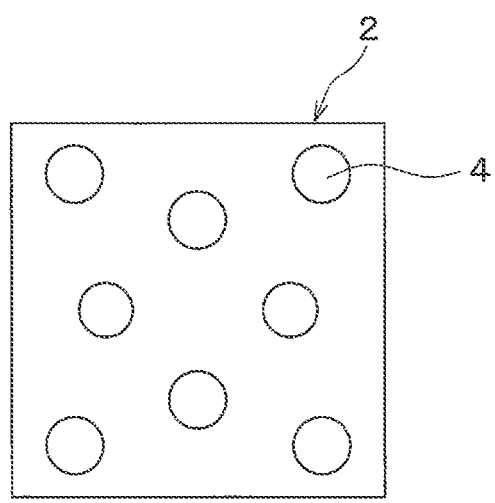
FIG. 2 is a diagram illustrating a plan view of the semiconductor device according to the first embodiment.

In the present embodiment, as shown in FIG. 2, eight spacers 4 are formed on the back surface of the semiconductor chip 2. Note that FIG. 2 illustrates a plan view of the semiconductor chip 2 in which the four spacers 4 are formed, when viewed from the back surface side Four of the eight spacers 4 are formed at the four corners of the back surface of the semiconductor chip 2, and thus are located on the vertexes of the rectangle surrounding the center of gravity of the semiconductor chip 2. The other four of the eight spacers 4 are formed in inner peripheral areas of the back surface of the semiconductor chip 2, and are located on vertexes of a rectangle surrounding the center of gravity of the semiconductor chip 2.

In the present embodiment, the spacers 4 are each made of a resin that is cured by heat or ultraviolet ray. Depending on use of the semiconductor device, the spacers 4 are preferably made of a material having low stress or low coefficient of linear expansion. The spacers 4 may be made of a metal of such as Ag paste or a solder ball, or a material similar to the adhesive.

Each of the spacers 4 is deposited in a circular region on the back surface of the semiconductor chip 2. When the diameter of the circular region is increased, the height of the spacer 4 can be increased. The diameter of the region where the spacer 4 is deposited and the height of the spacer 4 are controlled by the viscosity or the thixotropic value of the material.

The bonding wires 5 are used for electrically connecting the semiconductor chip 2 to the substrate 1. The bonding wires 5 are connected to pads (not shown) formed on the front surface of the semiconductor chip 2. As shown in FIG. 1, the bonding wires 5 are connected to the semiconductor chip 2 at positions corresponding to the spacers 4. In the case where the bonding wires 5 are arranged in this manner, portions of the semiconductor chip 2 which receive stress during wire-bonding are supported by the spacers 4. Therefore, even in a case where the adhesive 2 is soft, the wire-bonding can be stably conducted.

The sealing resin 6 is formed to cover the semiconductor chip 2, the adhesive 3, the spacers 4 and the bonding wires 5 on the front surface of the substrate 1.

Figure 3A:
FIG. 3A is a diagram illustrating a cross-sectional view of a step for manufacturing the semiconductor device shown in FIG. 1.
Figure 3B:
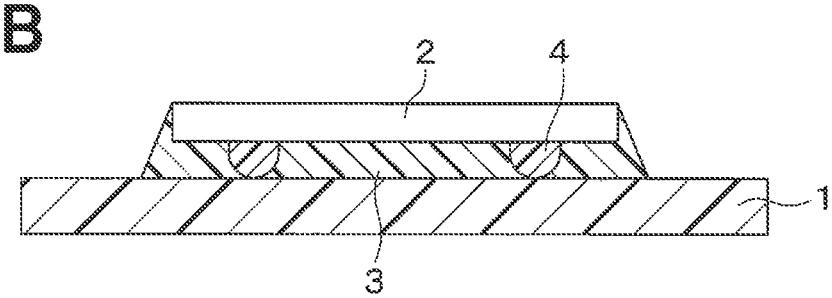
FIG. 3B is a diagram illustrating a cross-sectional view of a step for manufacturing the semiconductor device subsequent to the step shown in FIG. 3A.
Figure 3C:
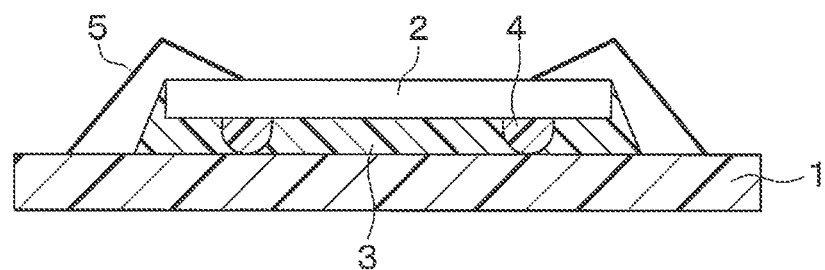
FIG. 3C is a diagram illustrating a cross-sectional view of a step for manufacturing the semiconductor device subsequent to the step shown in FIG. 3B.

A method for manufacturing the semiconductor device of the present embodiment will be descried with reference to FIGS. 3A to 3C. In a step shown in FIG. 3A, a resin is applied onto the back surface of the semiconductor chip 2 using a jet dispenser. Specifically, the resin is applied in the shape of spots so that the resin is located on the vertexes of the polygon surrounding the center of gravity of the semiconductor chip 2 in the in-plane direction of the back surface of the semiconductor chip 2. Then, the applied resin is cured by heat or ultraviolet ray. In this way, the spacers 4 bonded onto the back surface of the semiconductor chip 2 are formed.

In the present embodiment, the spacers 4 are formed after the wafer in which semiconductor elements are formed is cut into chips by dicing cut. Alternatively, the spacers 4 may be formed in the wafer in which the semiconductor elements have been formed, and then the wafer may be cut by dicing cut to thereby form the semiconductor chips 2.

In a step shown in FIG. 3B, the back surface of the semiconductor chip 2 is fixed to the front surface of the substrate 1 using the adhesive 3. In this case, the tip ends of the spacers 4 formed on the back surface of the semiconductor chip 2 are brought into contact with the substrate 1. Thus, the distance between the substrate 1 and the semiconductor chip 2 is equalized to the height of the spacers 4. In other words, the distance between the substrate 1 and the semiconductor chip 2 is regulated by the spacers 4. When the semiconductor chip 2 is fixed to the substrate 1, the spacers 4 bonded to the semiconductor chip 2 can be used as alignment marks.

In the step shown in FIG. 3B, the semiconductor chip 2 may be fixed to the substrate 1 after the adhesive 3 is applied to the substrate 1. Alternatively, the semiconductor chip 2 may be fixed to the substrate after the adhesive 3 is applied to the semiconductor chip 2.

In a step shown in FIG. 3C, wire bonding is performed for electrically connecting the pads (not shown) form on the surface of the semiconductor chip 2 and the substrate 1. In this case, bonding wires 5 are placed at locations corresponding to the spacers 4 and connected to the semiconductor chip 2. Thus, the wire bonding can be performed stably even when the adhesive 3 is soft.

After the step shown in FIG. 3C, a resin is applied to cover the semiconductor chip 2, the adhesive 3, the spacers 4 and the bonding wires 5, and thus the sealing resin 6 is formed. In this way, the semiconductor device of the present embodiment shown in FIG. 1 is produced.

In the present embodiment in which the spacers 4 are arranged as described above, the semiconductor chip 2 is supported by the spacers 4 at opposite sides of the center of gravity. Thus, it is less likely that the semiconductor chip 2 will be inclined relative to the substrate 1 due to its weight.

In the manufacturing method using an adhesive containing spherical particles, the step of mixing the adhesive and the spherical particles is necessary. In the present embodiment, on the other hand, such a mixing step is not necessary. Thus, it is possible to simplify the manufacturing process of the semiconductor device. In a case where the viscosity of the adhesive is high, it is difficult to mix the adhesive and the spherical particles. In the present embodiment, even if a material having a high viscosity is used for the adhesive 3, the semiconductor device can be manufactured in a similar manner to a case where a material having a low viscosity is used.

Figure 4:
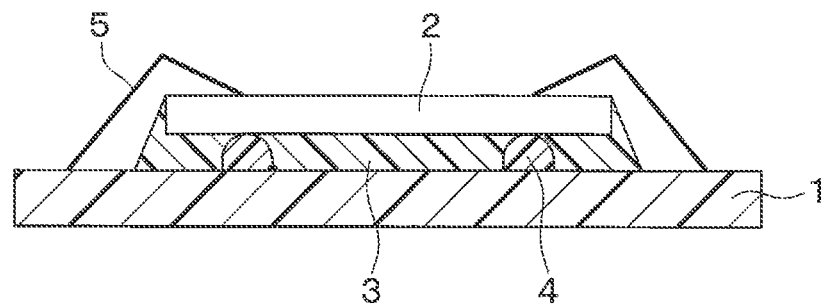
FIG. 4 is a diagram illustrating a cross-sectional view of a modification of the first embodiment.

In the present embodiment, the spacers 4 are bonded to the back surface of the semiconductor chip 2. Alternatively, as shown in FIG. 4, the spacers 4 may be bonded to the front surface of the substrate 1. Also in such a configuration, it is less likely that the semiconductor chip 2 will be inclined relative to the substrate 1, similarly to the present embodiment. Note that illustration of the sealing resin 6 is omitted in FIG. 4 and in FIGS. 6 to 9.

Figure 5:
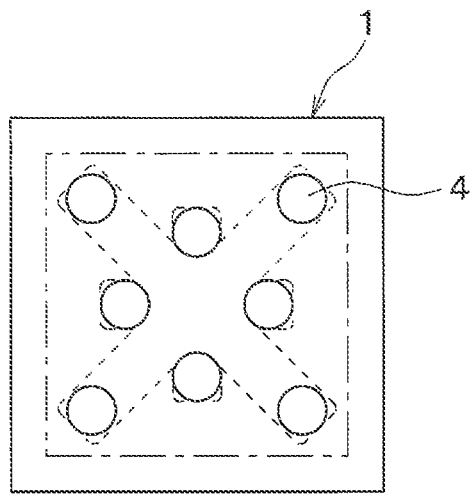
FIG. 5 is a diagram illustrating a plan view of a manufacturing step of the modification of the first embodiment.

In such a configuration, in the case where the adhesive 3 is applied to the substrate 1 in the step shown in FIG. 3B, the spacers 4 restrict the adhesive 3 from excessively expanding while the semiconductor chip 2 is fixed to the substrate 1. For example, in a case where the adhesive 3 is applied to the middle of a region where the semiconductor chip 2 is placed, the adhesive 3 can stay in the area surrounded by the dashed line in FIG. 5, that is, in an area near the spacers 4 and inside the spacers 4 of the region where the semiconductor chip 2 is placed. Note that FIG. 5 shows a plan view of the substrate 1 on which the spacers 4 are formed, when the substrate 1 is viewed from the front surface side, and the semiconductor chip 2 is placed in the region surrounded by an alternate long and short dashed line.

Also in the case where the spacers 4 are bonded to the front surface of the substrate 1, the spacers 4 can be used as alignment marks while the semiconductor chip 2 is fixed to the substrate 1.

Second Embodiment

A second embodiment will be described. In the second embodiment, the configuration of the spacers 4 is modified from that of the first embodiment, and the other configurations are similar to those of the first embodiment. Thus, only the configuration different from the first embodiment will be described.

Figure 6:
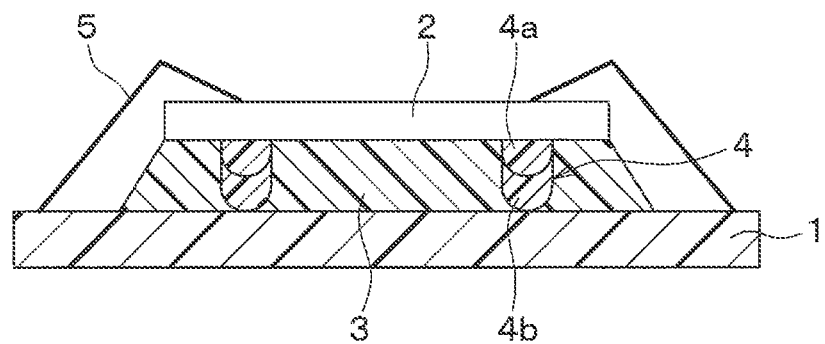
FIG. 6 is a diagram illustrating a cross-sectional view of a semiconductor device according to a second embodiment.

As shown in FIG. 6, spacers 4 of the present embodiment are each made of a first layer 4*a* formed on the back surface of the semiconductor chip 2 and a second layer 4*b*, formed on the surface of the first layer 4*a*. The first layer 4*a* and the second layer 4*b*, are each made of a resin.

Such a spacer 4 is formed in such a manner that: a resin for forming the first layer 4*a* is applied to the back surface of the semiconductor chip 2 and cured thereon to form the first layer 4*a*; and a resin for forming the second layer 4*b*, is then applied to the surface of the first layer 4*a* and cured.

The height of the spacer 4 formed by applying a resin one time is provided by the surface tension of the like. In the case where the second layer 4*b*, is formed by further applying the resin on the surface of the first layer 4*a* as described above, the height of the spacer 4 can be increased as compared to the case where the spacer 4 is formed by applying the resin one time. Further, the stress caused by the difference of coefficient of linear expansion between the substrate 1 and the semiconductor chip 2 can be reduced.

Third Embodiment

A third embodiment will be described. In the third embodiment, the configuration of the spacers 4 is modified from that of the first embodiment, and the other configurations are similar to those of the first embodiment. Thus, only the configuration different from the first embodiment will be described.

Figure 7:
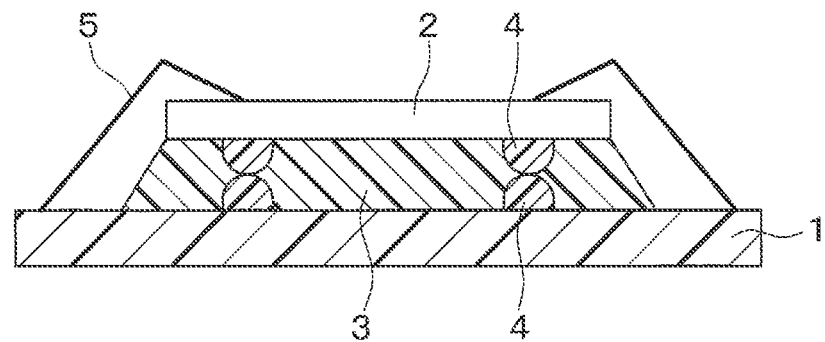
FIG. 7 is a diagram illustrating a cross-sectional view of a semiconductor device according to a third embodiment.

As shown in FIG. 7, in the present embodiment, a part of the spacers 4 is formed on the front surface of the substrate 1, and the other spacers 4 is formed on the back surface of the semiconductor chip 2. The spacers 4 formed on the front surface of the substrate 1 are bonded to the front surface of the substrate 1, and the spacers 4 formed on the back surface of the semiconductor chip 2 are bonded to the back surface of the semiconductor chip 2. The distance between the substrate 1 and the semiconductor chip 2 is regulated as the spacers 4 formed on the front surface of the substrate 1 and the spacers 4 formed on the back surface of the semiconductor chip 2 are stacked on top of the other.

As described above, since the spacers 4 formed on the substrate 1 and the semiconductor chip 2 are stacked on top of the other, the distance between the substrate 1 and the semiconductor chip 2 can be increased. Also, the stress due to the difference of coefficient of linear expansion between the substrate 1 and the semiconductor chip 2 can be reduced.

Fourth Embodiment

A fourth embodiment will be described. In the fourth embodiment, the configuration of the spacers 4 is modified from that of the first embodiment, and the other configurations are similar to those of the first embodiment. Thus, only the configuration different from the first embodiment will be described.

Figure 8:
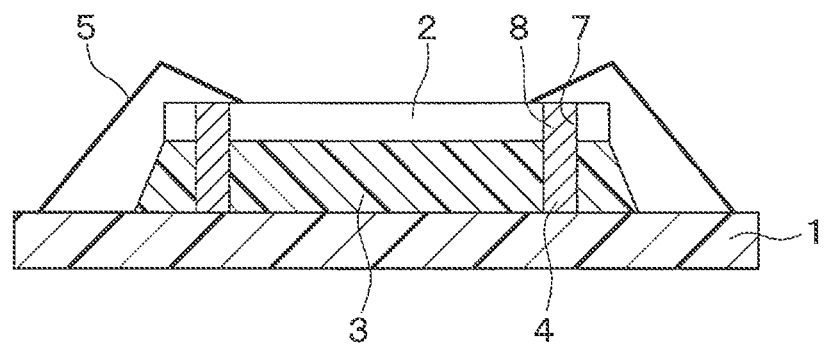
FIG. 8 is a diagram illustrating a cross-sectional view of a semiconductor device according to a fourth embodiment.

As shown in FIG. 8, in the present embodiment, the semiconductor chip 2 is formed with vias 7 (silicon penetrating vias) that penetrate the semiconductor chip 2 in a thickness direction of the semiconductor chip 2. The spacers 4 is each provided by a metal layer 8 that is formed inside of the via 7 and on the back surface of the semiconductor chip 2. Note that the via 7 and the metal layer 8 do not serve as wiring for electrically connecting the semiconductor chip 2 and circuits formed on the substrate 1, and are formed separately from wirings that electrically connect the semiconductor chip 2 and circuits of the substrate 1.

Such a semiconductor device is manufactured, for example, in a following manner. A semiconductor element is formed on a front surface of a Si substrate, and vias 7 are formed to penetrate the Si substrate. A metal layer 8 is filled in the vias 7 by plating, and then a part of a rear side of the Si substrate is removed by etching to protrude the metal layer 8. Thereafter, similarly to the first embodiment, the adhering, the wire bonding and the resin sealing are performed.

Also in the present embodiment in which the spacers 4 are provided by the metal layers 8, similarly to the first embodiment, it is less likely that the semiconductor chip 2 will be inclined relative to the substrate 1.

Fifth Embodiment

A fifth embodiment will be described. In the fifth embodiment, the number of the semiconductor chip 2 is modified from that of the first embodiment, and the other configurations are similar to those of the first embodiment. Thus, only the configuration different from the first embodiment will be described.

Figure 9:
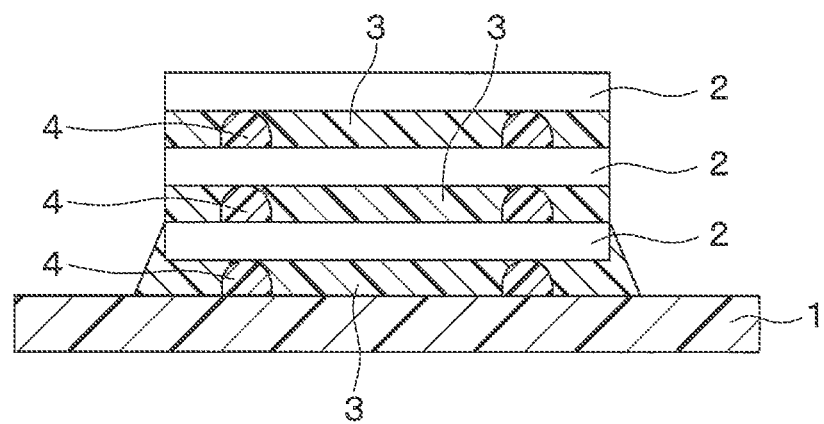
FIG. 9 is a diagram illustrating a cross-sectional view of a semiconductor device according to a fifth embodiment.

As shown in FIG. 9, in the present embodiment, a semiconductor device has a plurality of semiconductor chips 2 stacked on top of another. Between two of the adjacent semiconductor chips 2, a back surface of one semiconductor chip 2 is fixed to a front surface of the other semiconductor chip 2 with an adhesive 3. A back surface of one of the semiconductor chips 2 is fixed to the front surface of the substrate 1 with an adhesive 3. The adhesive 3 that fixes the semiconductor chip 2 to the substrate 1 corresponds to a first adhesive, and the adhesive 3 that fixes the semiconductor chip 2 to adjacent semiconductor chip 2 corresponds to a second adhesive.

A part of the plurality of spacers 4 is bonded to the front surface of the substrate 1, and the other spacers 4 are arranged between the adjacent semiconductor chips 2. The spacers 4, which are arranged between the adjacent semiconductor chips 2, are bonded to one of the semiconductor chips 2 nearer to the substrate 1, and are located on vertexes of a polygon surrounding the center of gravity of the other semiconductor chip 2 in an in-plane direction of the back surface of the other semiconductor chip 2. Further, the spacers 4 regulate the distance between the adjacent two semiconductor chips 2. The spacers 4 arranged between the substrate 1 and the semiconductor chip 2 correspond to first spacers, and the spacers 4 arranged between the adjacent semiconductor chips 2 correspond to second spacers.

In the configuration in which the plurality of semiconductor chips 2 are stacked on top of another described above, the spacers 4 can be arranged between the adjacent semiconductor chips 2, in a similar manner to the first embodiment. As such, it is less likely that, between two of the adjacent semiconductor chip 2, one will be inclined relative to the other.

Other Embodiment

The present disclosure is not limited to the above embodiments, can be suitably changed within the scope of the present disclosure, and also includes various modifications and deformations within the range of equivalency. The above embodiments relate to each other. Appropriate combinations of the embodiments are possible unless clearly not possible. In each above embodiment, the components forming each above embodiment are not always required unless explicitly stated as essential and clearly considered essential in principle. In each above embodiment, when numerals such as the number, value, amount, and range of the components of the embodiments are described, the numerals are not limiting unless explicitly stated as essential and clearly limited to specific numerals in principle. In each above embodiment, when materials, shapes, or positional relationship of the components are described, the materials, shapes, or positional relationship are not limiting unless explicitly stated and limited to specific materials, shapes, or positional relationship in principle.

For example, in the second embodiment described above, the spacers 4 may be formed on the front surface of the substrate 1. In the fifth embodiment descried above, the spacers 4 that regulate the distance between the substrate 1 and the semiconductor chip 2 may be bonded to the back surface of the semiconductor chip 2. In the fifth embodiment described above, between two of the adjacent semiconductor chips 2, the spacers 4 may be bonded to the back surface of one of the semiconductor chips 2, which is further from the substrate 1 than the other.

In the third or fifth embodiment described above, the spacers 4 may be each provided by the first layer 4a and the second layer 4b, similarly to the second embodiment.

Figure 10:
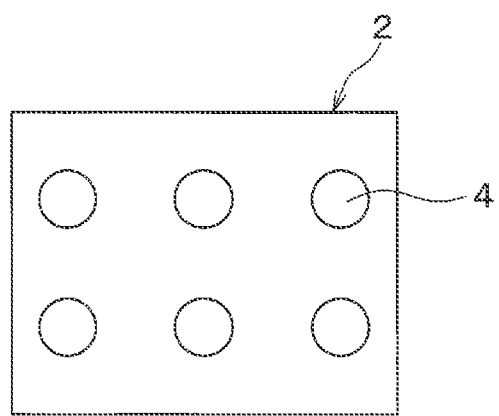
FIG. 10 is a diagram illustrating a plan view of a semiconductor device according to another embodiment.

In the first embodiment described above, the spacers 4 may be placed at other locations in the in-plane direction of the back surface of the semiconductor chip 2. For example, as shown in FIG. 10, six spacers 6 may be formed on the back surface of the semiconductor chip 2 to be located on vertexes of a rectangle surrounding the center of gravity of the semiconductor chip 2 and on midpoints of opposite sides of the rectangle. Note that FIG. 10 shows a plan view when the semiconductor chip 2 on which the spacers 4 are formed is viewed from a back surface side.

What is claimed is:

1. A semiconductor device comprising:
    a substrate provided by a printed board;
    a semiconductor chip disposed adjacent to a front surface of the substrate;
    an adhesive fixing a back surface of the semiconductor chip to the front surface of the substrate;
    a plurality of spacers disposed between the front surface of the substrate and the back surface of the semiconductor chip to regulate a distance between the substrate and the semiconductor chip; and
    a plurality of bonding wires wherein:
    the spacers are bonded to the front surface of the substrate or the back surface of the semiconductor chip, and are located on respective vertexes of a polygon surrounding a center of gravity of the semiconductor chip,
    the spacers are harder than the adhesive,
    all the bonding wires are connected to a front surface of the semiconductor chip opposite to the back surface of the semiconductor chip at positions directly above the spacers, and
    the spacers are located on respective vertexes of a triangle surrounding the center of gravity of the semiconductor chip in the in-plane direction of the back surface of the semiconductor chip.

2. The semiconductor device according to claim 1, wherein:
    a part of the spacers is bonded to the front surface of the substrate, and the other of the spacers is bonded to the back surface of the semiconductor chip, and
    the part of the spacers bonded to the front surface of the substrate and the other of the spacers bonded to the back surface of the semiconductor chip are stacked on top of another to regulate the distance between the substrate and the semiconductor chip.

3. The semiconductor device according to claim 1, wherein
    the spacers are each provided by a first layer made of a resin and a second layer made of a resin and formed on a surface of the first layer.

4. The semiconductor device according to claim 1, wherein
    the spacers are arranged symmetrically with respect to a center of the semiconductor chip in the in-plane direction of the back surface of the semiconductor chip.

5. The semiconductor device according to claim 1, wherein:
    the semiconductor chip includes a plurality of semiconductor chips stacked on top of another,
    the adhesive is a first adhesive,
    the spacers are first spacers,
    the semiconductor device further comprises:
        a second adhesive that fixes, between adjacent two of the semiconductor chips, a back surface of one semiconductor chip to a front surface of the other semiconductor chip; and
        a plurality of second spacers that are bonded, between the adjacent two semiconductor chips, to the back surface of the one semiconductor chip or the front surface of the other semiconductor chip, and located at vertexes of a polygon surrounding the center of gravity of the other semiconductor chip in an in-plane direction of the back surface of the other semiconductor chip to regulate a distance between the adjacent two semiconductor chips, and the second spacers are located at positions corresponding to the first spaces in a stacking direction of the substrate and the plurality of semiconductor chips.

6. The semiconductor device according to claim 1, wherein:
the printed board is made of an epoxy resin as a base material,
the semiconductor chip is made of Si and formed with a semiconductor element, and
the adhesive is made of a silicone resin, and
the back surface of the semiconductor chip is fixed to the front surface of the substrate with the adhesive through the spacers.

7. The semiconductor device according to claim 1, wherein:
the printed board is made of a glass epoxy resin,
the semiconductor chip is made of Si and formed with a semiconductor element,
the adhesive is made of a silicone resin, and
the back surface of the semiconductor chip is fixed to the front surface of the substrate with the adhesive through the spacers.

8. A semiconductor device comprising:
a substrate provided by a printed board;
a semiconductor chip disposed adjacent to a front surface of the substrate;
an adhesive fixing a back surface of the semiconductor chip to the front surface of the substrate;
a plurality of spacers disposed between the front surface of the substrate and the back surface of the semiconductor chip to regulate a distance between the substrate and the semiconductor chip; and
a plurality of bonding wires, wherein:
the spacers are bonded to the front surface of the substrate or the back surface of the semiconductor chip, and are located on respective vertexes of a polygon surrounding a center of gravity of the semiconductor chip,
the spacers are harder than the adhesive,
a part of the spacers is bonded to the front surface of the substrate, and the other of the spacers is bonded to the back surface of the semiconductor chip,
the spacers bonded to the front surface of the substrate and the spacers bonded to the back surface of the semiconductor chip are stacked on top of another to regulate the distance between the substrate and the semiconductor chip,
all the bonding wires have first ends connected to a front surface of the semiconductor chip opposite to the back surface of the semiconductor chip and second ends connected to the front surface of the substrate,
the first ends of all the bonding wires are connected only at positions directly above the spacers on the front surface of the semiconductor chip, and
the spacers are located on respective vertexes of a triangle surrounding the center of gravity of the semiconductor chip in the in-plane direction of the back surface of the semiconductor chip.

9. The semiconductor device according to claim 8, wherein
the spacers are disposed only at positions directly under the bonding wires.

10. A semiconductor device comprising:
a substrate provided by a printed board;
a single semiconductor chip disposed adjacent to a front surface of the substrate;
an adhesive fixing a back surface of the semiconductor chip to the front surface of the substrate;
a plurality of spacers being harder than the adhesive and disposed between the front surface of the substrate and the back surface of the semiconductor chip to regulate a distance between the substrate and the semiconductor chip, the spacers being arranged on respective vertexes of a polygon surrounding a center of gravity of the semiconductor chip;
a plurality of bonding wires; and
a sealing resin covering the semiconductor chip, the bonding wires, and the adhesive on the front surface of the substrate, wherein:
all the bonding wires have first ends connected to a front surface of the semiconductor chip opposite to the back surface of the semiconductor chip and second ends connected to the front surface of the substrate,
the first ends of all the bonding wires are connected only at positions directly above the spacers on the front surface of the semiconductor chip, and
the spacers are arranged on respective vertexes of a triangle surrounding the center of gravity of the semiconductor chip in the in-plane direction of the back surface of the semiconductor chip.

* * * * *